United States Patent [19]
Takeuchi

[11] Patent Number: 5,162,253

[45] Date of Patent: Nov. 10, 1992

[54] METHOD OF PRODUCING CAPACITIVE ELEMENT INTEGRATED CIRCUIT

[75] Inventor: Kiyoshi Takeuchi, Tokyo, Japan

[73] Assignee: NEC Corporation, Tokyo, Japan

[21] Appl. No.: 863,105

[22] Filed: Apr. 3, 1992

[30] Foreign Application Priority Data

Apr. 5, 1991 [JP] Japan .................................. 3-72688

[51] Int. Cl.⁵ .............................................. H01L 21/70
[52] U.S. Cl. ......................................... 437/60; 437/47;
437/52; 437/919
[58] Field of Search ................... 437/47, 48, 52, 60,
437/919; 357/23.6, 51

[56] References Cited

U.S. PATENT DOCUMENTS 5,006,481  4/1991  Cham et al. .......................... 437/919

FOREIGN PATENT DOCUMENTS

| 0112066 | 7/1982 | Japan | 357/23.6 |
| 0089450 | 5/1984 | Japan | 357/51 |
| 0231851 | 12/1984 | Japan | 357/23.6 |
| 0074470 | 4/1985 | Japan | 357/51 |
| 1-47858 | 6/1989 | Japan | 357/23.6 |

OTHER PUBLICATIONS

"3-Dimensional Stacked Capacitor Cell for 16M and 64M Drams", T. Ema, et al., 1988 IEEE International Electron Devices Meeting, pp. 592-595.

"A Spread Stacked Capacitor (SSC) Cell for 64MBIT Drams", S. Inoue, et al., 1989 IEEE International Electron Devices Meeting, pp. 31-34.

*Primary Examiner*—Tom Thomas
*Attorney, Agent, or Firm*—Burns, Doane, Swecker & Mathis

[57] ABSTRACT

For a process of producing a capacitive element with a storage node electrode formed of layered electrode, there is proposed a method of preventing an unstable condition that a part of the storage node electrode during the processes is positioned in the air without support therebelow. The storage node electrode is formed by embedding a polysilicon plug in an aperture which reaches to a silicon active layer on a silicon substrate from the surface where a polysilicon capacitive electrode is formed on a polysilicon capacitive electrode provided thereon with the first capacitive insulating film. After a second capacitive insulating film and a polysilicon capacitive electrode are formed, the polysilicon capacitive electrodes are connected with each other by a polysilicon plug to form a cell plate electrode.

3 Claims, 4 Drawing Sheets

METHOD OF PRODUCING CAPACITIVE ELEMENT INTEGRATED CIRCUIT

BACKGROUND OF THE INVENTION

The present invention relates to a method of producing capacitive elements for integrated circuits.

In densification of dynamic random access memories (DRAM), despite of the minimized area per bit a larger capacitance value per unit area is still required since the capacitance value of the capacitor for storing data is difficult to decrease because of limitation caused by a desired resistivity against alpha ray. A thinner insulating film for the capacitor may be applicable as a measure of avoiding the foregoing problem, notwithstanding a reduction of the insulating film thickness is limited. For a large capacity DRAM of four megabits or more, there has been proposed a method wherein the capacitance is obtained on the inside wall of the aperture provided in the substrate (trench capacitance) or the capacitance is obtained at the side wall of the capacitive electrode of a taller height (stack capacitance). Those methods, however, may not be applied for the DRAM of 64 megabits or more due to its excess depth and height. Thus, a method of employing laminated capacitive electrodes is proposed for the DRAM of 64 megabits or more to obtain the enlarged surface area of the stack capacitive electrodes but without increasing the height. An example of such structure includes "a memory cell having fin type capacitors" proposed by T. Ema et al at "the International Electron Devices Meeting" in 1988, the Meeting Papers, p. 592.

In FIG. 1, an installation of impurity on a silicon substrate 201 provides a silicon active layer 202. A layer-to-layer insulating film 210 made of silicon nitride and a spacer 211 made of silicon dioxide are sequentially deposited. With a contact aperture which reaches an active layer 202 and through the contact aperture there is provided a polysilicon capacitive electrode 214 forming a storage node electrode (so called fin) of memory cell capacitance connected to the silicon active layer 202.

In FIG. 2, the spacer 211 is selectively removed to expose the lower surface of the polysilicon capacitive electrode 214 and a capacitive insulating film 205 is formed on the entire exposed surface of the polysilicon capacitive electrode 214. A polysilicon capacitive electrode 204 is formed by a vapor phase growth procedure for embedding the periphery of the capacitive insulating film 205 and actuating as an opposing electrode to the polysilicon capacitive electrode 214 through the capacitive insulating film 205.

The polysilicon capacitive electrode 204 is a cell-plate electrode of memory-cell capacitance to be commonly connected to all the cells for fixing at a reference voltage. By this arrangement the polysilicon capacitive electrode 204 embraces the polysilicon capacitive electrode 214 from the above and below thereof to increase the capacitive value. Further, the capacitive insulating film 205 and the polysilicon capacitive electrode 204 may continuously be formed to produce a capacitive insulating film of high quality.

However, in the conventional method hereinbefore described, a part of the electrode, during its production process, has no support thereunder to float unstably in the atmosphere with a problem of weakened mechanical strength for the positioning. A high grade of capacitive insulating film is required to be formed in a narrower gap by a complete embedding with an electrode material. The production process, therefore, is not so conveniently that a thicker material with a wider gap are needed with limitation of the shape available to the electrode.

SUMMARY OF THE INVENTION

A method of producing a capacitive element for an integrated circuit in accordance with the invention employs two electrodes A and B constituting capacitive elements for use in an integrated circuit, wherein at least a part of the electrode A is constituted of a conductor A1, at least a part of the electrode B is constituted of a conductor B1, a part of the conductor A1 and a part of the conductor B1 are arranged respectively above and below embracing a capacitive insulating film, a part of a conductor A2 is arranged below the conductor B1 embracing the capacitive insulating film, a portion of the conductor A1 where the conductor B1 is not present therebelow and a portion of the conductor A2 where the conductor B1 is not present thereabove are connected with each other and the method comprises the steps of forming the conductor A2 to provide a first capacitive insulating film on the surface of the conductor A2, forming the conductor B1 on the portion where the conductor A2 is not present and on a part of the conductor A2 and further forming a second capacitive insulating film on an exposed surface of the conductor A2 and on the surface of the conductor B1, forming the conductor A1 on a part of the conductor B1 and at least on a part of the conductor A2, forming an aperture or a recess on a part of the region where the conductor A1 is formed on the conductor A2 so that the aperture or the recess penetrates the conductor A1 to reaches the conductor A2 and depositing the conductors on the inside wall of the aperture or the recess.

In a method of production according to the invention, the capacitive element laminated with the capacitive electrodes may be obtained without a process in which the electrode material is unstably floated in the atmosphere. This results in more convenient production of the thinner possible electrode on a principle, thus the larger capacitance value may be obtained by increasing the number of lamination of the electrodes within a limited height. Further, the capacitive insulating film and the electrode layer covering the insulating film may continuously be formed.

PREFERRED EMBODIMENTS OF THE INVENTION

Figure 1:
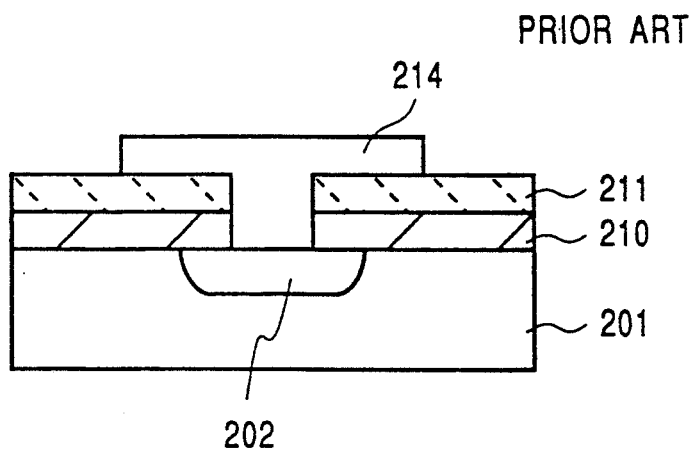
FIG. 1 is a sectional view of the capacitive element illustrative of the conventional method of producing the capacitive element for the integrated circuit.
Figure 2:
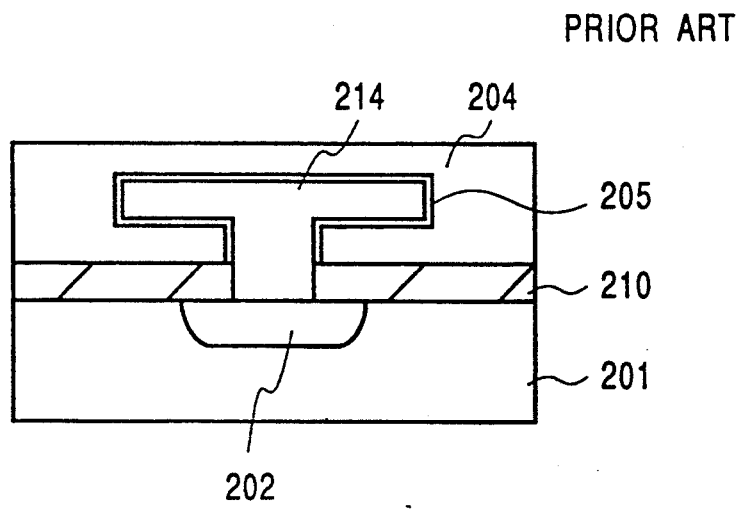
FIG. 2 is a sectional view of the capacitive element illustrative of another conventional device of producing the capacitive element for the integrated circuit.
Figure 3:
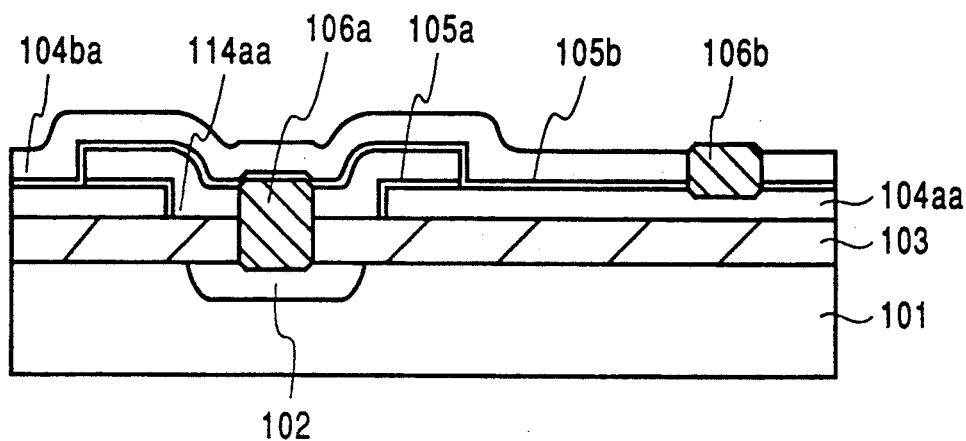
FIG. 3 is a sectional view of the capacitive element for the integrated circuit of the first embodiment according to the invention.

In the first embodiment of FIG. 3, a polysilicon capacitive electrode 114aa constitutes a storage node electrode and polysilicon capacitive electrodes 104aa and 104ab provide a cell plate electrodes.

A silicon active layer 102 is formed on a silicon substrate 101 where a layer-to-layer insulating film 103 covers the entire surface thereof. The layer-to-layer insulating film 103 is not limited to the silicon nitride film, unlike the conventional example. The polysilicon film is formed by deposition to produce a polysilicon capacitive electrode 104aa and a first capacitive insulating film 105a is formed on the entire surface. The polysilicon capacitive electrode 104aa is formed on the region at least other than a part of the silicon active layer 102. The capacitive insulating film 105a is formed on an exposed surface of the layer-to-layer insulating film 103 and on the succeeding process the capacitive insulating layer 105a is remained without removing, but the residue of the capacitive insulating layer 105a at this portion has substantially no relationship with the invention and thus omitted throughout in the drawings. A polysilicon film is deposited to form the polysilicon capacitive electrode 114aa in the region in which the silicon active layer 102 is included. The polysilicon capacitive electrode 114aa is required to be shaped into the form having a gap through which a polysilicon plug 106b may pass without any contact with the polysilicon capacitive electrode 114aa.

An aperture is provided by etching to reach the silicon active layer 102 through the polysilicon capacitive electrode 114aa. A polysilicon plug 106a is inserted into the aperture to contact the silicon active layer 102 with the polysilicon capacitive electrode 114aa. The polysilicon or the other material like tungsten may be employed forth plug material. The first capacitive insulating film 105a at its portion which is not coated with the polysilicon capacitive electrode 114aa is once removed and then the second capacitive insulating film 105b is again formed on the entire surface. Thereafter, the polysilicon film is deposited on the entire surface to produce a polysilicon capacitive electrode 104ab.

In the region where the polysilicon capacitive electrode 104aa is formed underneath the polysilicon capacitive electrode 104ab through the capacitive insulating film 105b, an aperture is provided by etching to reach the polysilicon capacitive electrode 104aa through the polysilicon capacitive electrode 104ab. The aperture is embedded with the polysilicon plug 106b to connect the polysilicon electrode 104aa with the polysilicon capacitive electrode 104ab. The aperture may reach the layer-to-layer insulating film 103.

In the embodiment, connections by means of the plug formed in the aperture provided between the conductive layers may take place for twice, i.e. one for forming the storage node electrode and another for forming the cell plate electrode.

Figure 4:
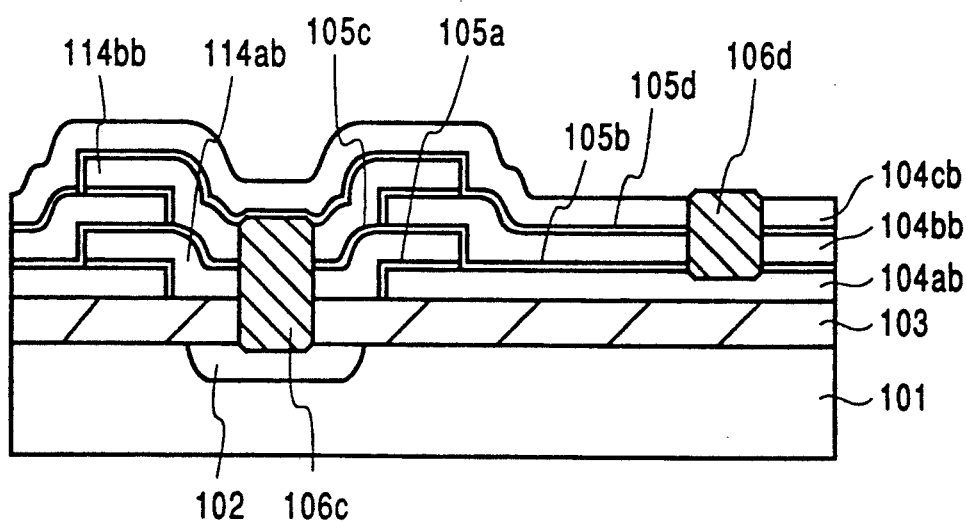
FIG. 4 is a sectional view of the capacitive element of the second embodiment of the invention.

The second embodiment as shown in FIG. 4 is an advanced modification of the first embodiment where the storage node electrode is constituted of two layers of the polysilicon capacitive electrode 114ab and a polysilicon capacitive electrode 114bb and the cell plate electrode is comprised of three layers of the polysilicon capacitive electrodes 104ab and 104bb and a polysilicon capacitive electrode 104cb.

The polysilicon capacitive electrodes 104ab and 114ab are formed by the same method of producing the polysilicon capacitive electrodes 104aa and 114aa as is the case of the first embodiment. The capacitive insulating film 105a is then removed through a mask of the polysilicon capacitive electrode 114ab and the second capacitive insulating film 105b is formed on the entire surface. The polysilicon capacitive electrode 104bb is formed under the same limitation as in the polysilicon capacitive electrode 104ab. The capacitive insulating film 105b is removed by applying a mask as the polysilicon capacitive electrode 104bb to provide the third capacitive insulating film 105c on the entire surface. The polusilicon capacitive electrode 114bb is formed under the same limitation as in the polysilicon capacitive electrode 114ab.

An aperture is provided by etching to reach the silicon active layer 102 penetrating the polysilicon capacitive electrodes 114bb and 114ab from the surface of the polysilicon capacitive electrode 114bb. The aperture is embedded with a polysilicon plug 106c to connect the silicon active layer 102 and the polysilicon capacitive electrodes 114ab and 114bb with each other. The exposed portion of the capacitive insulating film 105c is then removed to provide the fourth capacitive insulating film 105d on the entire surface. Thereafter, a polysilicon capacitive electrode 104cb is formed on the entire surface.

In the region, the polysilicon capacitive electrode 104bb is formed underneath the polysilicon capacitive electrode 104cb through the capacitive insulating film 105d and the polisilicon capacitive electrode 104ab is formed underneath the policilicon capacitive electrode 104bb through the capacitive insulating film 105b, an aperture is provided by etching to reach the polysilicon capacitive electrode 104ab penetrating the polysilicon capacitive electrodes 104cb and 104bb from the surface of the polysilicon capacitive electrode 104cb. A polysilicon plug 106d is embedded in the aperture to connect the polysilicon capacitive electrodes 104ab, 104bb and 104cb with each other.

The embodiment provides the polysilicon capacitive electroe of three layers connected by a single polysilicon plug to provide the cell plate electrode. A method of producing more layered electrode is obvious over this embodiment.

Figure 5:
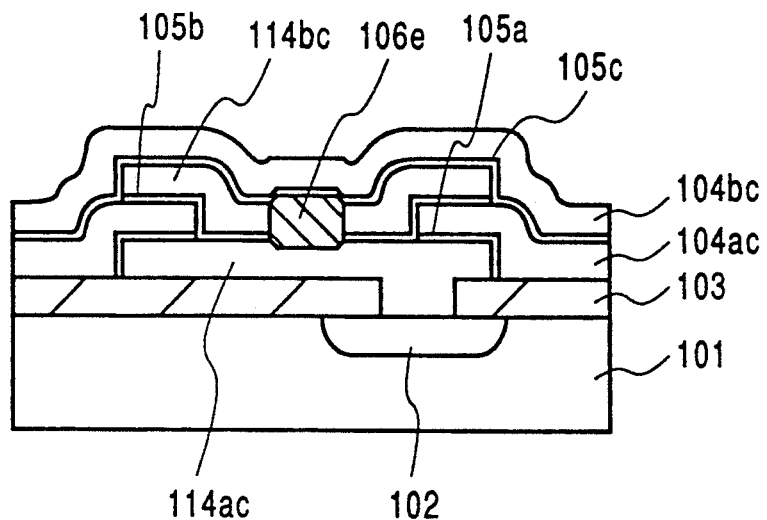
FIG. 5 is a sectional view of the capacitive element of the third embodiment of the invention.

In the third embodiment in FIG. 5, an aperture is provided in the layer-to-layer insulating film 103 to reach the active layer 102 and a polysilicon capacitive electrode 114ac is formed in the region coating the aperture. Thereafter, a formation of the first capacitive insulating film 105a, a formation of a polysilicon capacitive eectrode 104ac, a selective remove of the capacitive insulating film 105a, a formation of the secon capacitive insulating film 105b, a formation of a polysilicon capacitive electrode 114bc, a formation a polysilicon plug 106e for connecting a polysilicon capacitive electrode 114bc with the polysilicon capacitive electrode 114ac, selective remove of the capacitive insulating film 105b, a formation of the third capacitive insulating film 105c and a formation of the polysilicon capacitive electrode 104bc are sequentially carried out. An excess boring of the aperture but to a small extent is allowable for receiving the polysilicon plug 106e according to the embodiment. The same method as is the case of the first embodiment may be applied to this embodiment for providing the plug which connects the polysilicon capacitive electrode 104ac and 104bc with each other to produce the cell plate electrode.

Figure 6:
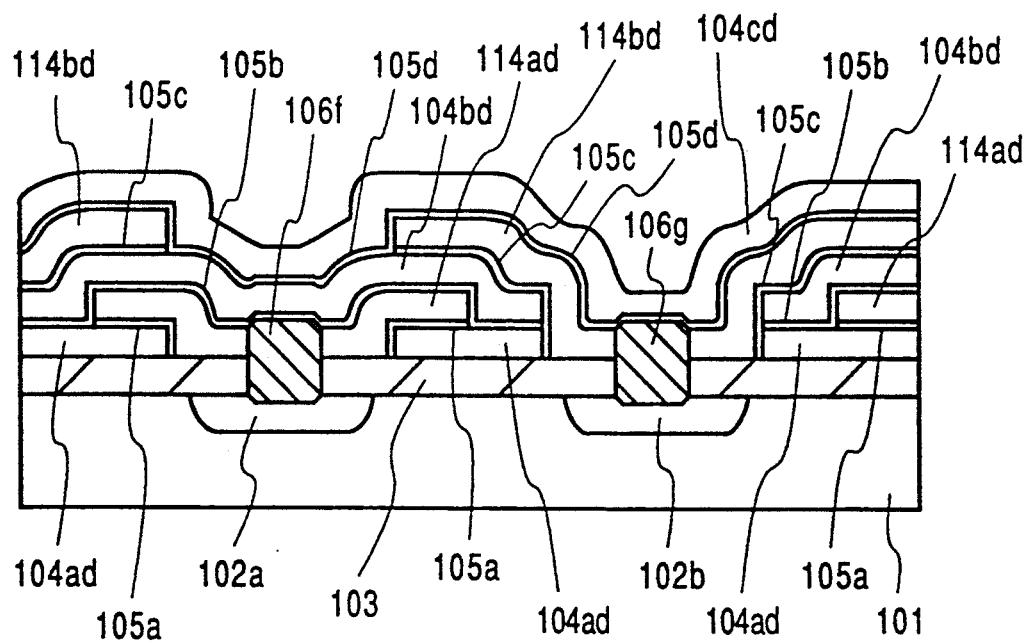
FIG. 6 is a sectional view of the capacitive element of the fourth embodiment of the invention.
Figure 7:
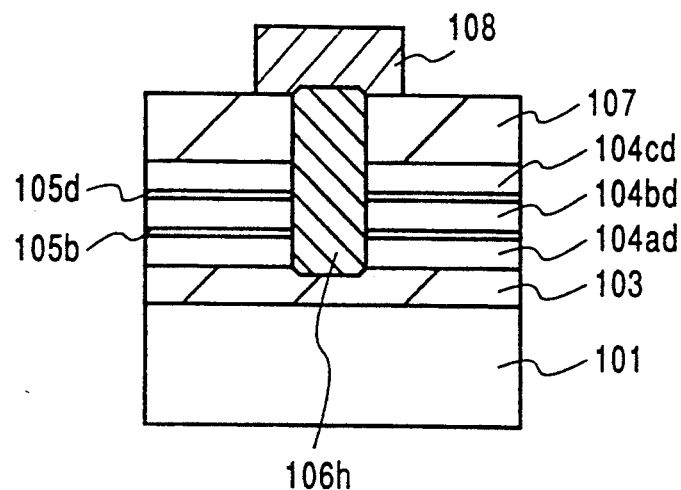
FIG. 7 is a fragmentarily sectioned view of the capacitive element illustrative a connection of the cell plate electrodes in the fourth embodiment of the invention.
Figure 8:
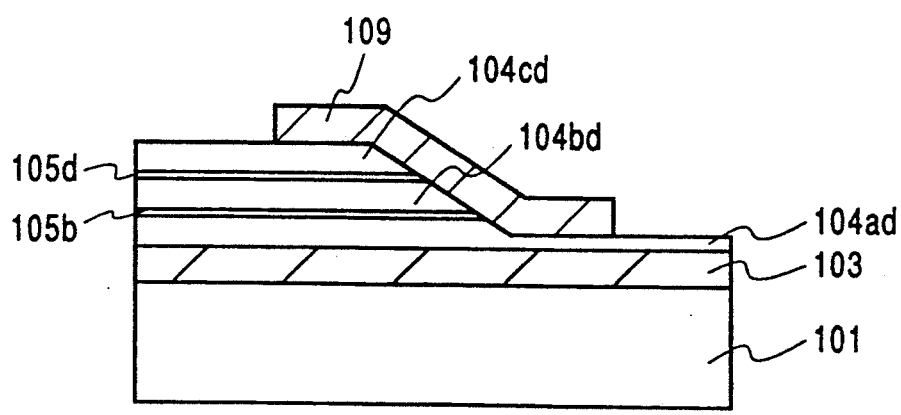
FIG. 8 is a fragmentarily sectioned view of the capacitive element illustrative another connection of the cell plate electrodes in the fourth embodiment of the invention.

The fourth embodiment of FIG. 6 to 8 includes an example in which the invention is applied to "the memory cell structure with an increased capacitance per unit area by laminating adjacent storage node electrodes with each other" proposed by Inoue et al in "the International Electron Devices Meeting" in 1989, the Meeting Papers, p. 31.

In FIG. 6, the adjacent storage node electrodes laminated with each other includes a polysilicon capacitive electrode 114ad connected with a silicon active layer 102a through a polysilicon plug 106f and a polysilicon capacitive electrode 114bd connected with a silicon active layer 102b through a polysilicon plug 106g. The cell plate electrode is constituted of polysilicon capacitive electrodes 104ad, 104bd and 104cd.

A method of production according to this embodiment includes a number of steps of forming the polysilicon capacitive electrode 104ad, the first capacitive insulating film 105a, the polysilicon capacitive electrode 114ad, the polysilicon plug 106f, the second capacitive insulating film 105b and the polysilicon capacitive electrode 104bd as is the case of the first embodiment, removing the polysilicon capacitive electrodes 104bd and 104ad of the region including at least a part of the region just above the silicon active layer 102b, forming the third capacitive insulating film 105c, forming the polysilicon capacitive electrode 114bd, forming the polysilicon plug 106g, selectively removing the capacitive insulating film 105c, forming the fourth capacitive insulating film 105d and forming the polysilicon capacitive electrode 104cd. Thus, the structure as shown in FIG. 4 may be obtained.

In the first method in FIG. 7, the second layer-to-layer insulating film 107 is formed on the entire surface, before an aperture which reaches at least the polysilicon capacitive electrode 104ad from the layer-to-layer insulating film 107 is provided at the portion on which the polysilicon capacitive electrodes 104cd, 104bd and 104ad are laminated through the capacitive insulating films 105d and 105b. A polysilicon plug 106h is embedded in the aperture to connect the polysilicon capacitive electrodes 104cd, 104bd and 104ad with each other. Finally, an aluminum electrode 108 is formed for connection with the polysilicon plug 106h to obtain the structure as shown in FIG. 7.

In a second method in FIG. 8, an interconnection 109 of the polysilicon is provided at an oblique cut region where the polysilicon capacitive electrodes 104cd, 104bd and 104ad only are superimposed through the capacitive insulating films 105d and 105b so that the polysilicon capacitive electrodes 104cd, 104bd and 104ad are connected with each other to obtain the structure as shown in FIG. 8.

The method of interconnection of the cell plate electrodes according to this embodiment of FIG. 7 and 8 may apparently be applied to the other embodiments.

As hereinbefore fully described, in accordance with the invention, the processes for producing the capacitive elements of various shapes with the layered storage node electrode may prevent such unstable condition that the storage node electrode partially floats in the air without support thereunder during the production operation. This reduces considerably limitation to thickness and largeness of the electrode layer for production enabling to increase the number of layers to be laminated with use of a larger capacitance value per unit area. An advantage of the method capable of continuously forming the capacitive insulating films and the electrode layers embracing the films are satisfactorily maintained like the conventional example.

What is claimed is:

1. A method of producing a capacitive element for an integrated circuit having two electrodes A and B constituting capacitive elements for use in an integrated circuit wherein at least a part of the electrode A is constituted of a conductor A1, at least a part of the electrode B is constituted of a conductor B1, a part of the conductor A1 and a part of the conductor B1 are arranged respectively above and below embracing a capacitive insulating film, a part of a conductor A2 is arranged below the conductor B1 embracing the capacitive insulating film, a portion of the conductor A1 where the conductor B1 is not present therebelow and a portion of the conductor A2 where the conductor B1 is not present thereabove are connected with each other, characterized by the steps of forming the conductor A2 to provide a first capacitive insulating film on the surface of the conductor A2, forming the conductor B1 on the portion where the conductor A2 is not present and on a part of the conductor A2, and further forming a second capacitive insulating film on an exposed surface of the conductor A2 and on the surface of the conductor B1, forming the conductor A1 on a part of the conductor 81 and at least on a part of the conductor A2, providing an aperture or a recess on a part of the region where the conductor A1 is formed on the conductor A2 so that the aperture or the recess penetrates the conductor A1 to reach the conductor A2 and depositing the conductors on the inside wall of the aperture or the recess.

2. A method of producing a capacitive element for an integrated circuit as claimed in claim 1, wherein the conductors A1, A2, B1 and B2 are conductors made of polysilicon.

3. A method of producing a capacitive element for an integrated circuit as claimed in claim 1, wherein conductors to be deposited on the inside wall of the aperture or the recess are made of polysilicon.

* * * * *

UNITED STATES PATENT AND TRADEMARK OFFICE
CERTIFICATE OF CORRECTION

PATENT NO. : 5,162,253
DATED : November 10, 1992
INVENTOR(S) : Kiyoshi TAKEUCHI

It is certified that error appears in the above-indentified patent and that said Letters Patent is hereby corrected as shown below:

In Column 6, line 43, delete "81" and insert therefor --B1--;

In Column 6, line 48, delete "the conductors" and insert therefor -- a conductor--;

In Column 6, line 52, before "B1" insert --and --;

In Column 6, line 52, delete "and B2";

In Column 6, lines 55-56, delete "conductors" and insert therefor -- the conductor --; and In Column 6, line 57, delete "are" and insert therefor -- is --.

Signed and Sealed this

Twenty-second Day of February, 1994

Attest:

BRUCE LEHMAN

*Attesting Officer*  *Commissioner of Patents and Trademarks*